(12) United States Patent
Paton (10) Patent No.: US 6,297,159 B1
(45) Date of Patent: Oct. 2, 2001

(54) METHOD AND APPARATUS FOR CHEMICAL POLISHING USING FIELD RESPONSIVE MATERIALS

(75) Inventor: Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/350,975

(22) Filed: Jul. 7, 1999

(51) Int. Cl.[7] .................. H01L 21/302; H01L 21/461
(52) U.S. Cl. ................... 438/693; 438/691; 438/692; 216/88; 216/89; 156/345; 451/36; 451/47; 451/53
(58) Field of Search ................. 438/691, 692, 438/693; 216/88, 89; 451/36, 41, 53; 156/345

(56) References Cited

U.S. PATENT DOCUMENTS

| | | | |
|---|---|---|---|
| 4,992,190 | * 2/1991 | Shtarkman | 252/62.52 |
| 5,354,490 | * 10/1994 | Yu et al. | 252/79.1 |
| 5,449,313 | * 9/1995 | Kordonsky et al. | 451/35 |
| 5,575,706 | * 11/1996 | Tsai et al. | 216/88 |
| 5,616,066 | 4/1997 | Jacobs et al. | 451/36 |
| 5,795,212 | 8/1998 | Jacobs et al. | 451/36 |
| 5,807,165 | * 9/1998 | Uzoh et al. | 451/41 |
| 6,083,839 | * 9/1998 | Wong | 438/693 |

* cited by examiner

Primary Examiner—Robert Kunemund
Assistant Examiner—Duy-Vu Deo
(74) Attorney, Agent, or Firm—Gerald Fisher; Deborah Wenocur (57) ABSTRACT

A process for, and apparatus for, Chemically-Mechanically Polishing (CMP) a semiconductor wafer with a slurry including ElectroRheological (ER) and/or MagnetoRheological (MR) fluids. The combination of the materials and an electric field provides inherent tuning of polishing rates, locally and globally, and improves flatness and uniformity, as well as minimizing recession and erosion.

20 Claims, 9 Drawing Sheets

METHOD AND APPARATUS FOR CHEMICAL POLISHING USING FIELD RESPONSIVE MATERIALS

FIELD OF THE INVENTION

This invention relates to an integrated circuit manufacturing process and an apparatus therefor and in particular to a method and apparatus for polishing of metal layers during fabrication of integrated circuits.

BACKGROUND OF THE INVENTION

A. Polishing of metal layers in IC processing

Chemical Mechanical Polishing (CMP) includes both chemical reaction and mechanical abrasion. It involves the use of a polishing slurry which contains chemically reactive components which form soft compounds with the surface region of the material being polished. The slurry also contains abrasive particles which mechanically preferentially remove the softer reacted surface region when the wafer is moved across the polishing pad having slurry thereon.

As integrated circuits become smaller, higher density, and faster, the process technology for manufacture of these circuits has undergone major transitions. With device critical dimensions decreasing below 0.25 microns, a major factor in limiting circuit response times is the metal interconnections connecting devices and circuit elements. Hence, decreasing the resistance of the metal lines, and reducing the capacitance between metal lines, are of great importance in IC process development. Two areas of development have been: 1) Cu metallization used in place of Al or Al alloy metallization due to the lower resistivity and higher electromigration resistance of Cu, and 2) use of low dielectric constant (low K) dielectrics as insulation between metal layers to reduce the capacitive coupling.

Use of Cu in IC metallization presents challenges, including the difficulties in reactive ion etching (RIE) of Cu. An alternative strategy to eliminate the requirement of RIE for Cu metallization is to use Damascene structures. This technique involves depositing an insulating layer, patterning and etching trenches in the insulation where the metal lines are to be placed, depositing Cu over the whole surface and into the trenches, and finally polishing off the surface Cu using Chemical Mechanical Polishing (CMP), thereby leaving only the embedded Cu lines in the trench regions. Related methods such as dual Damascene can integrate via and interconnect formation.

Figure 1A:
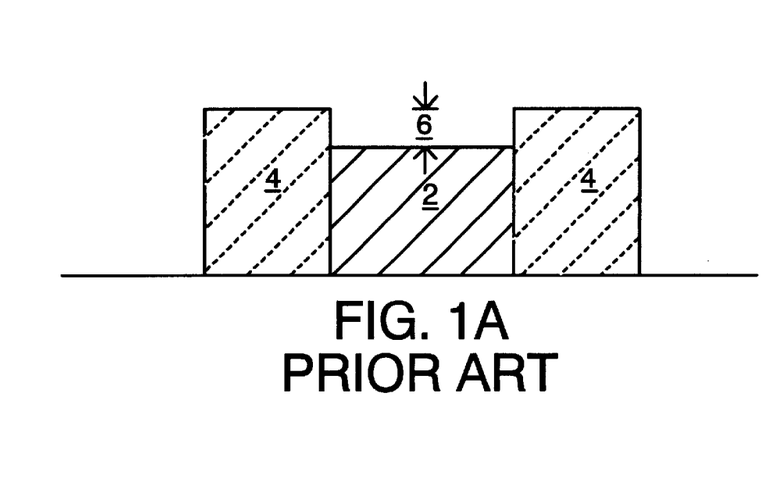
FIG. 1a is a schematic illustration of prior art recession caused by CMP.
Figure 1B:
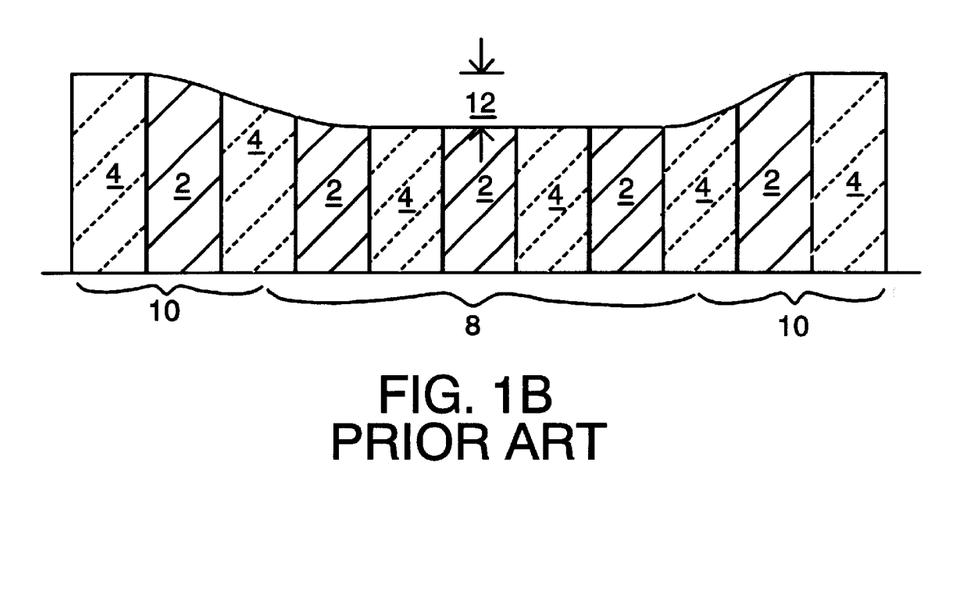
FIG. 1b is a schematic illustration of prior art erosion caused by CMP.

Current CMP technology requires refinement of polishing methods in order to avoid problems such as recession and erosion, as illustrated in FIGS. 1a and 1b. Current CMP technology also exhibits other types of Within-Wafer Non-Uniformity (WIWNU) of polish rate which result in uneven material removal across the wafer.

B. Field responsive materials

Field responsive materials exhibit a rapid, reversible, and tunable transition from a liquid-like, free-flowing state to a solid-like state, upon the application of an external field. These materials demonstrate dramatic changes in their rheological behavior (viscosity) in response to an externally applied electric or magnetic field, and are known as electrorheological (ER) fluids or magnetorheological (MR) fluids respectively. ER fluids may include linear dielectric particles (such as: silica, alumina, titania, barium titanate, semiconductors, weakly conducting polymers, zeolites, polyhydric alcohol, sodium carboxymethyl Sephadex, alginic acid, carboxymethyl Sephadex, lithium hydrazinium sulfate, or combinations thereof) colloidally dispersed in nonconducting continuous phase liquids (such as: silicone oils, mineral oils, paraffin oils, hydraulic oils, transformer oils, perfluorinated polyethers, or combinations thereof). Alternatively, homogeneous liquid-crystalline polymer-based materials are known, as reported by Inoue et al in the MRS Bulletin, August 1998. MR fluids comprise ferromagnetic or ferrimagnetic, magnetically nonlinear particles (such as: iron, iron alloys, iron oxide, iron nitride, iron carbide, carbonyl iron, low carbon steel, silicon steel, chromium dioxide, fumed or pyrogenic silica, silica gel, titanium dioxide, magnetite, nickel, cobalt, manganese, zinc, ceramic ferrites, or combinations thereof) dispersed in an organic or aqueous continuous phase liquid (such as: $H2O$, silicone oils, kerosene, mineral oils, paraffin oils, hydraulic oils, transformer oils, halogenated aromatic liquids, halogenated paraffins, diesters, polyoxyalkylenes, fluorinated silicones, cornstarch, olefin oil, glycol, or combinations thereof). Both ER and MR fluids may additionally comprise surfactants (which act as wetting agents) and thixotropic additives (which make the particles hydrophilic). Details of continuous phase liquids, particulates, surfactants, and thixotropic additives used for MR and ER fluids are found in US Patents having the following serial numbers: U.S. Pat. No. 5645752, U.S. Pat. No. 5167850, U.S. Pat. No. 4992190, U.S. Pat. No. 4033892, USRE032573, U.S. Pat. No. 3917538, and U.S. Pat. No. 4772407. All of these aforementioned patents are hereby incorporated by reference.

A feature shared by the ER and MR fluids is that after an external field is applied, the material rapidly transforms from a fluid into a weak viscoelastic solid, generally through the formation of chains and columns of the field responsive particles. These field-induced chain-like structures possess a non-zero shear modulus and a shear stress.

ER and MR materials are of interest in, and have been investigated for, such applications as engine mounts, shock absorbers, clutches, seat dampers, variable-resistance exercise equipment, earthquake-resistant high-rise structures, positioning devices, and optical polishing of aspherical surfaces. The materials science of field-responsive fluids is described in the MRS Bulletin, August 1998.

Optical glass polishing using MR fluids has been described by Jacobs et al in U.S. Pat. No. 5,616,066, issued Apr. 1, 1997, and in U.S. Pat. No. 5,795,212, issued Aug. 18, 1998. According to these patents, portions of the glass workpiece are selectively polished by moving the workpiece through a work zone having a stiffened MR fluid therein and therefore a high pressure. The MR finishing machine comprises an electromagnet, a trough for MR fluid containment, and a work spindle to which the curved glass workpiece is mounted.

ER and MR materials have not, to the best knowledge of the inventor, been utilized or investigated in the prior art for the polishing of metal layers in semiconductor processing. It is believed that their utilization for this application will enable solutions to some of the aforementioned problems which exist in current Al and Cu CMP technology, including recession and erosion, and other types of WIWNU.

SUMMARY OF THE INVENTION

It is therefore an object of this invention to provide a semiconductor manufacturing process for metal CMP and an apparatus therefor utilizing ER and/or MR materials.

It is a further object of this invention to provide a semiconductor manufacturing process for metal CMP and an apparatus therefor which is self-adjusting to provide maximum flatness across the wafer.

It is a further object of this invention to provide a semiconductor manufacturing process for metal CMP and an apparatus therefor which prevents recession and erosion of metal features.

These objects are met by using ER and/or MR materials as one component of CMP slurry, and by providing a method and apparatus for applying appropriate electric or magnetic fields across the ER and/or MR materials to cause their viscosity to self-adjust and alter the local polishing rates so as to yield a uniform flat surface across the wafer.

DETAILED DESCRIPTION OF THE INVENTION

FIG. 1a illustrates the prior art problem of recession seen with metal CMP. Metal 2 between oxide regions 4 is removed at a higher rate than the oxide, thereby causing a local recessed region 6 to be formed. FIG. 1b illustrates the problem of erosion, also seen with metal CMP. Erosion is a global effect rather than a local effect as in recession. In the example shown in FIG. 1b, the center portion 8 of the wafer is polished at a higher rate than the outer portion 10, thereby leaving a more highly eroded region 12.

According to a first set of embodiments of my invention, an electrorheological (ER) fluid is used as a component of a CMP slurry for metal layers in Damascene processing, with an external electric field applied across the ER fluid. The shear strength, or yield stress $\tau_0$ of the ER fluid is defined as the limit of the shear stress of the fluid as the shear rate approaches zero. The yield stress depends on both the electric field strength and on the frequency of the applied field according to the Maxwell-Wagner electrostatic polarization model, as $$\tau_0(E,\omega) E^2(\omega) \quad (1)$$

where $\tau_0(E,\omega)$=yield stress,

E=alternating electric field strength $\omega$=frequency of the alternating electric field, $\beta_{eff}$=effective relative particle polarizability The Maxwell-Wagner model predicts that the yield stress will increase with the square of the externally applied electric field. Additionally, the model predicts that the yield stress will increase with the square of the effective polarizability. A description of the electrostatic polarization mechanism is given by W. M. Winslow in J. Appl. Phys. 20, 1949, p 1137, which is hereby incorporated by reference.

Figure 2:
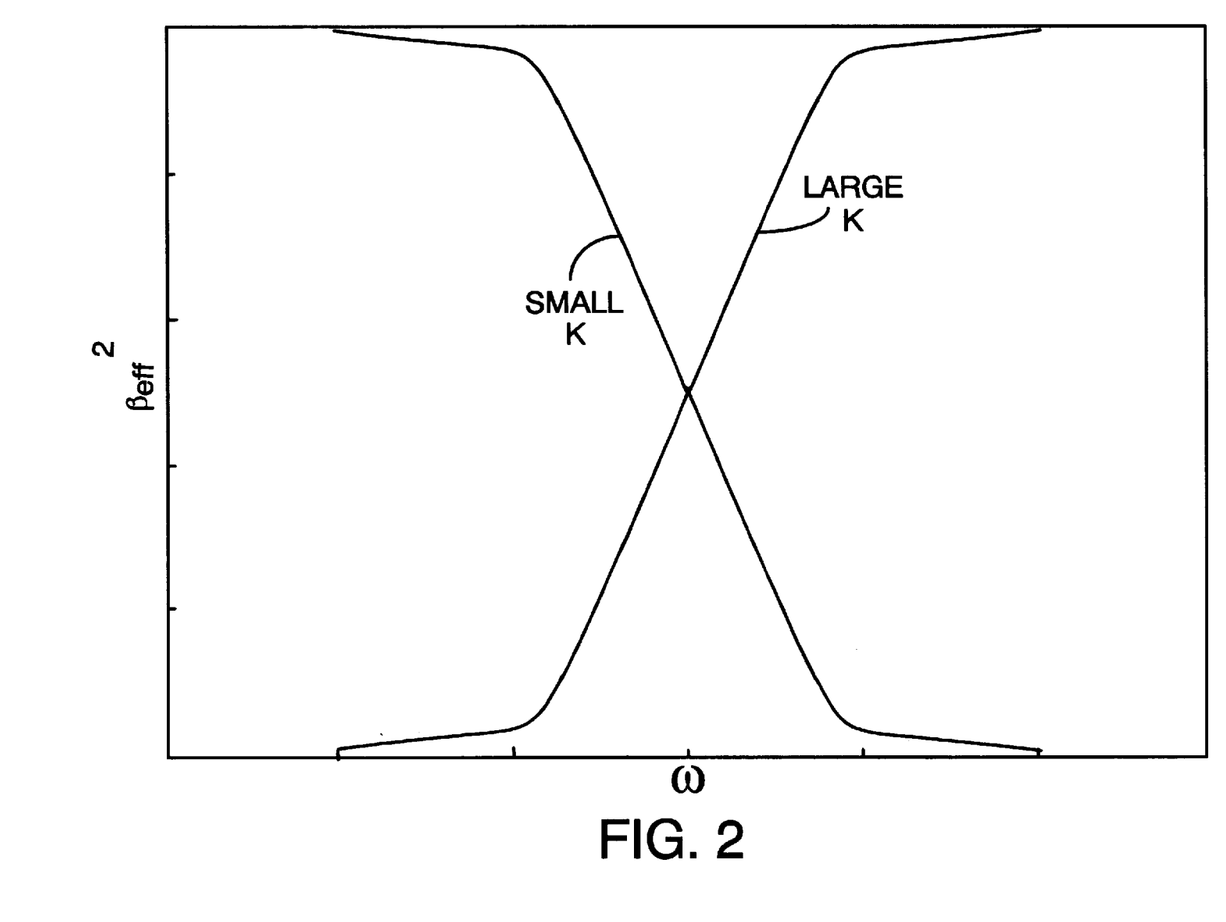
FIG. 2 is a graph of the frequency dependence of $\beta_{eff}$.

$\beta_{eff}$ depends on dielectric constants and conductivities of particulate and continuous phases of the ER fluid in question, as well as on frequency of the applied field. For particulates with relatively large dielectric constants, $\beta_{eff}^2$ increases with frequency, whereas for particulates with relatively small dielectric constants, $\beta_{eff}^2$ decreases with frequency, as illustrated in FIG. 2.

It can be shown that the viscosity $\eta$ varies linearly with $\tau_0(E)$ for a given shear rate. It is believed that, when using an ER fluid, the metal polish rate will vary directly as the viscosity of the fluid if all other factors such as rotational velocity, downward force on the spindle, etc., are held constant. It is believed that, according to the local topography of the metal surface being polished, the electric field strength will vary across the ER fluid, and thus will automatically tune the CMP polish rate, as described hereinafter.

Figure 3:
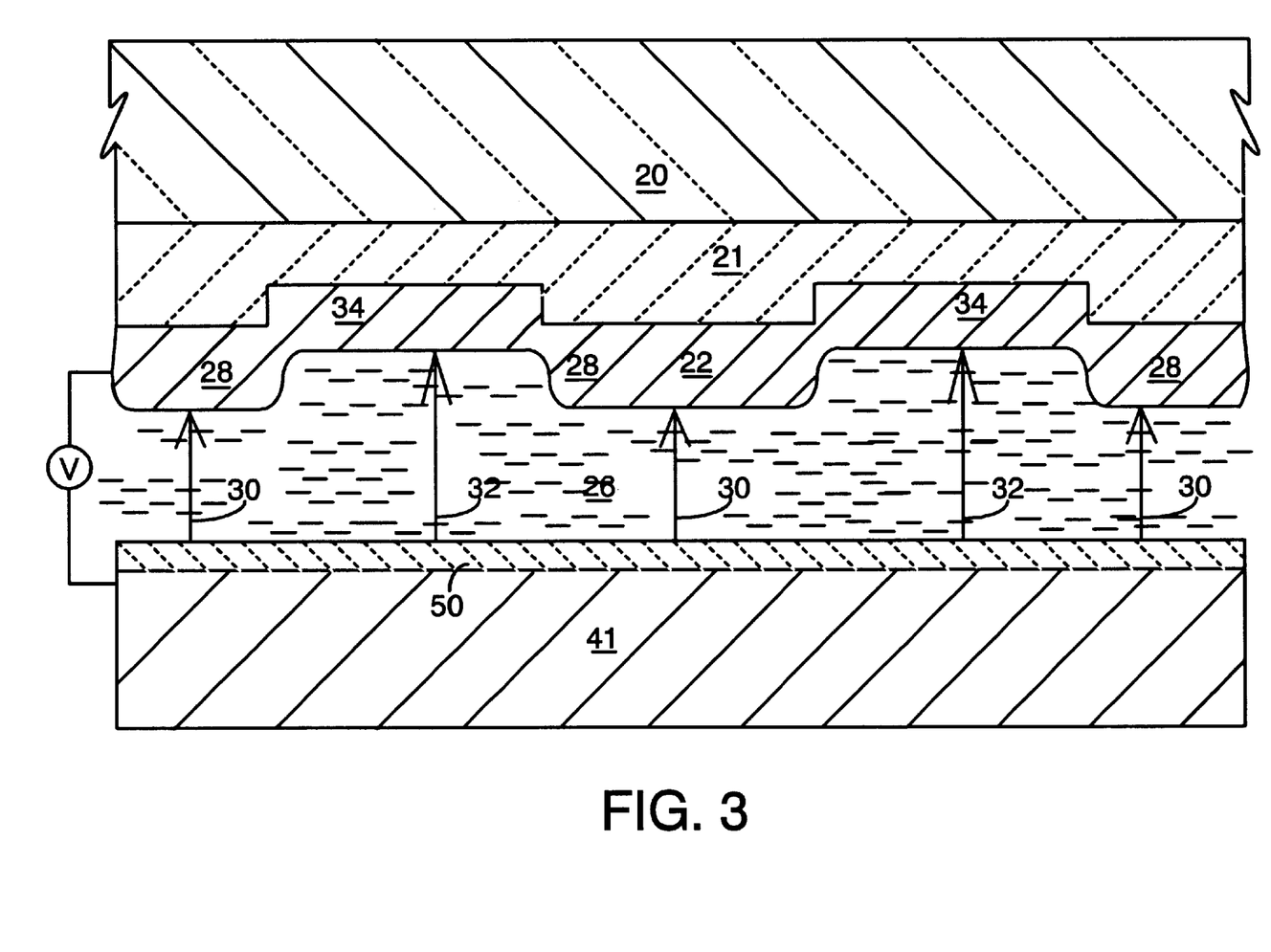
FIG. 3 is a side view of an ER fluid between a metal wafer surface and a polishing pad, with an applied electrical field therebetween.

FIG. 3 is a schematic diagram showing a wafer 20 having an oxide layer 21 and a metal layer 22 thereon, a platen 41 with polishing pad 50 thereon, and an ER fluid 26 therebetween. The ER continuous phase material must have insulating characteristics. A voltage V is applied between metal layer 22 and platen 41. An electric field is thereby established across ER fluid 26. In the first approximation of a uniform electric field, the relationship between voltage difference V and electric field E is expressed as:

$$E=V/d \quad (5)$$

where d is the distance between the two points having voltage difference V therebetween.

It is seen, therefore, that in the uniform field approximation, the electric field between metal layer 22 and platen 41 varies inversely with the distance therebetween. For raised metal regions 28, the local electric field 30 across ER fluid 26 is greater than the local electrical field 32 across ER fluid 26 for lower metal regions 34. According to equations (1), (2), and (3), a higher electric field E across the ER fluid results in a higher yield stress $\tau_0$ and higher viscosity $\eta$ of the ER fluid. Higher viscosity of the ER fluid in regions of higher E during polishing will cause the polishing rate to be higher in regions of higher electric field E. Accordingly, raised metal regions 28 will polish at a higher rate than lower metal regions 34, resulting in an automatic tuning of the polish rate to achieve increased flatness of the metal surface. Since the metal layer 22 is used as one of the electrodes, a built-in and localized polishing endpoint occurs as the metal electrode is polished away and the local electric field across the gap goes to zero.

In order to achieve the aforementioned chemical and abrasive components of CMP, a chemical oxidizer and abrasive may be incorporated into the ER continuous phase material. A requirement of any such combination of chemical oxidizer, abrasive, and ER material is its insulating characteristics.

Figure 4:
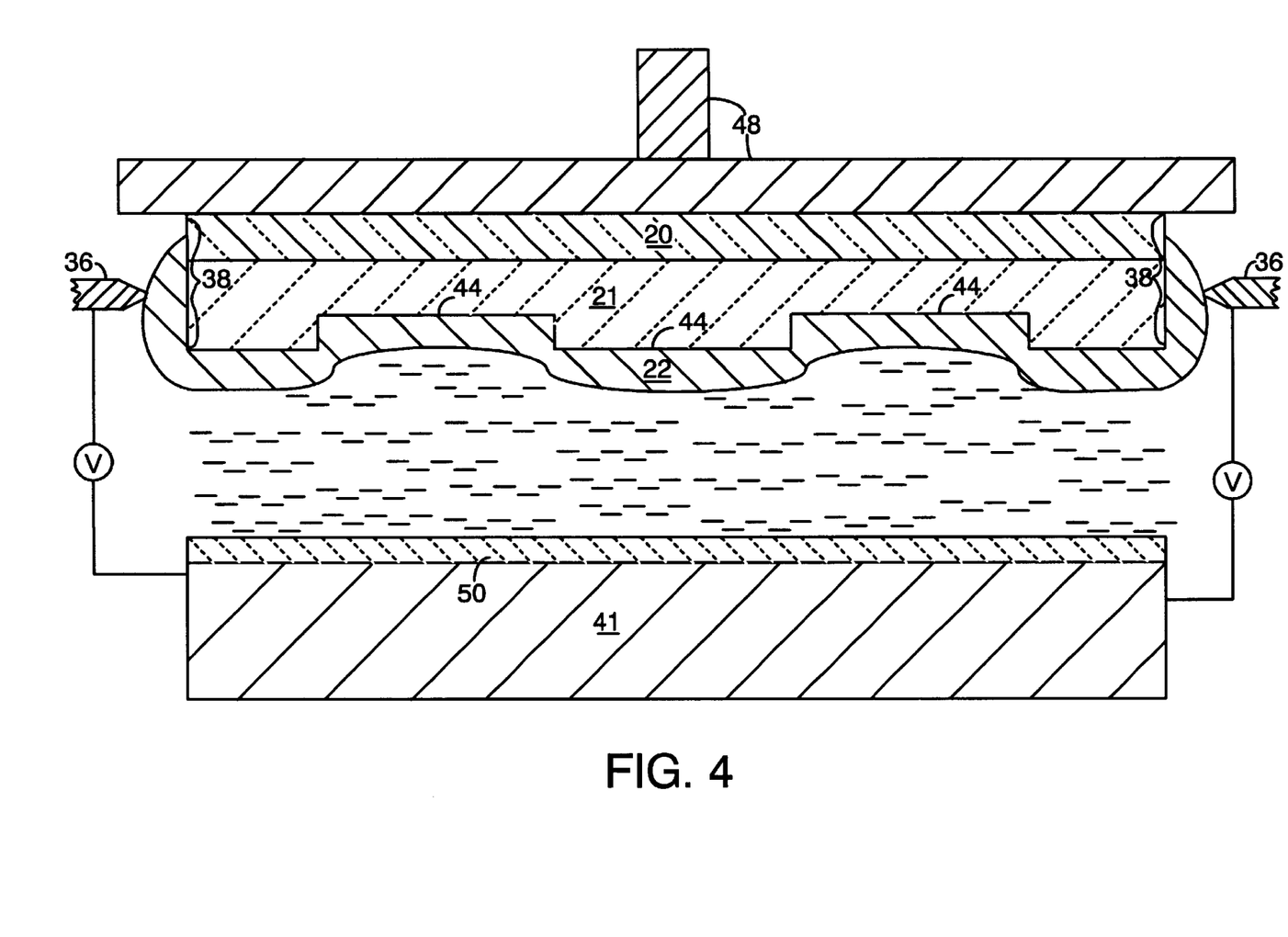
FIG. 4 illustrates an embodiment of the invention wherein electrical contact is made to the wafer edge.

The voltage V may be applied across the ER fluid in many different ways, depending on the configuration and structure of the wafers being polished, as well as the details of the polisher. FIG. 4 illustrates a first embodiment wherein one or more electrical contacts 36 are placed on edge 38 of wafer 20. Voltage V may be applied between contacts 36 and platen 41. (In this and all other embodiments described herein, platen 41 may be stationary, rotatable, or linearly movable). This embodiment can be used for a metallization process which provides metal deposited or electroplated on the wafer edge 38 as well as on the wafer top surface 44, whereby voltage V applied to contacts 36 is simultaneously applied to metal layer 22 which is contiguous with contacts 36. Contacts 36 may be, by way of example, pins surrounding the edge of the wafer which have thickness less than the thickness of the wafer.

Figure 5A:
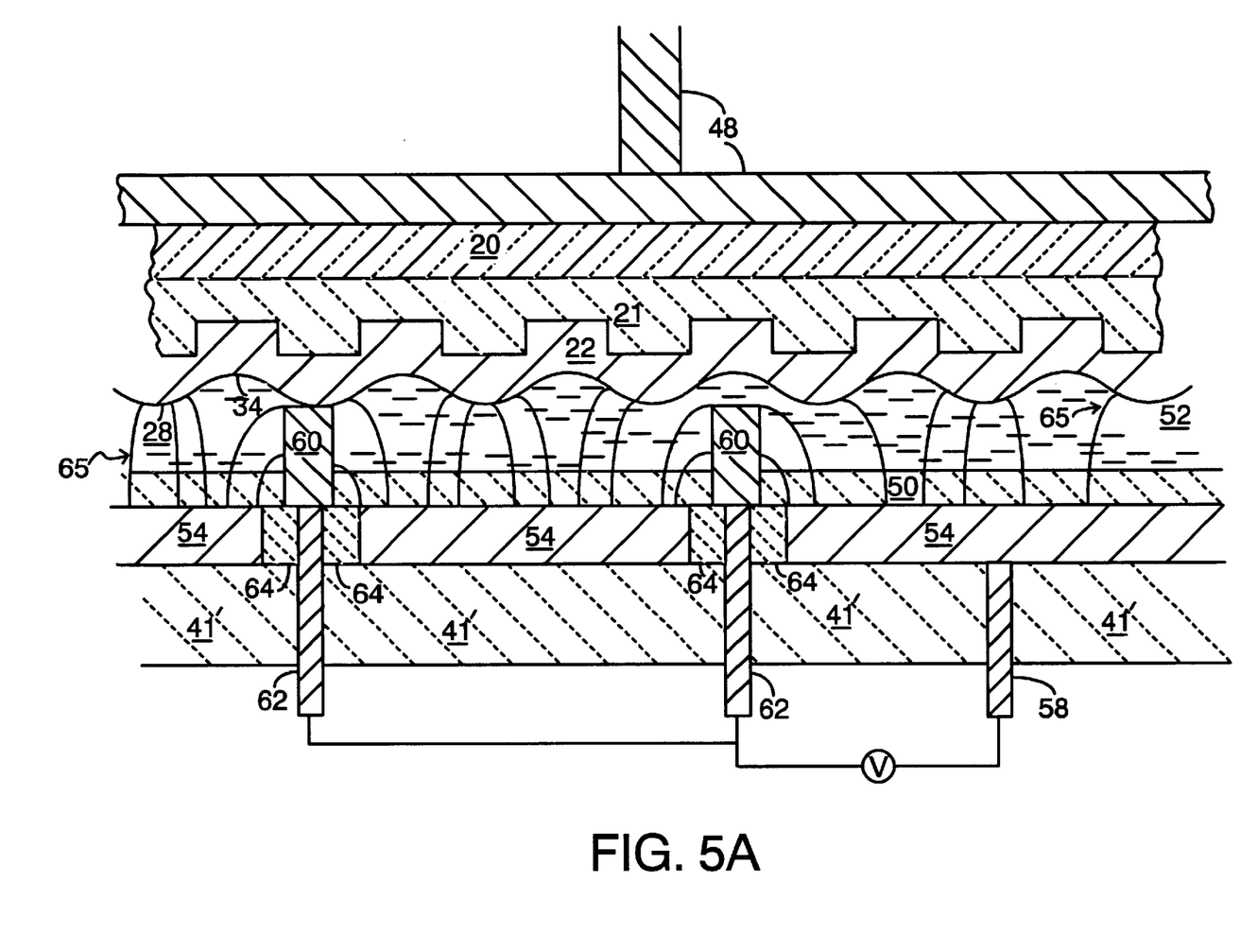
FIG. 5a illustrates an embodiment of the invention wherein electrical contact is made to the wafer front.

FIG. 5a illustrates a second embodiment of my invention which provides electrical contact with the front side of the wafer having the metal layer 22 thereon. Wafer 20 is held against spindle 40 by vacuum suction, and is brought into contact with, and moved relative to (generally rotated against), polishing pad 50 having ER fluid 52 thereon. Polishing pad 50 is made of an insulating material; atop metal electrode 54 which is positioned on insulating platen 41. Electrical contact 58 is made to electrode 54. Soft conducting contacts 60 are embedded in an array across polishing pad 50, and protrude from its surface. Contacts 60 are aligned against metal pins 62 which are directed through platen 41 and through insulating sheaths 64 embedded in metal electrode 54. Voltage V is applied between electrode 54 and contacts 60. As wafer 20 is brought into close proximity to polishing pad 50, physical contact is made between some or all of contacts 60 and metal layer 22 atop wafer 20. Voltage V is. thereby established between metal layer 22 and electrode 54, across ER fluid 52. Electric field lines 65 show that the electric field is higher at some raised metal regions 28 than at lower metal regions 34, thereby providing stiffer ER fluid and higher abrasion rate at some raised regions 28.

Figure 5B:
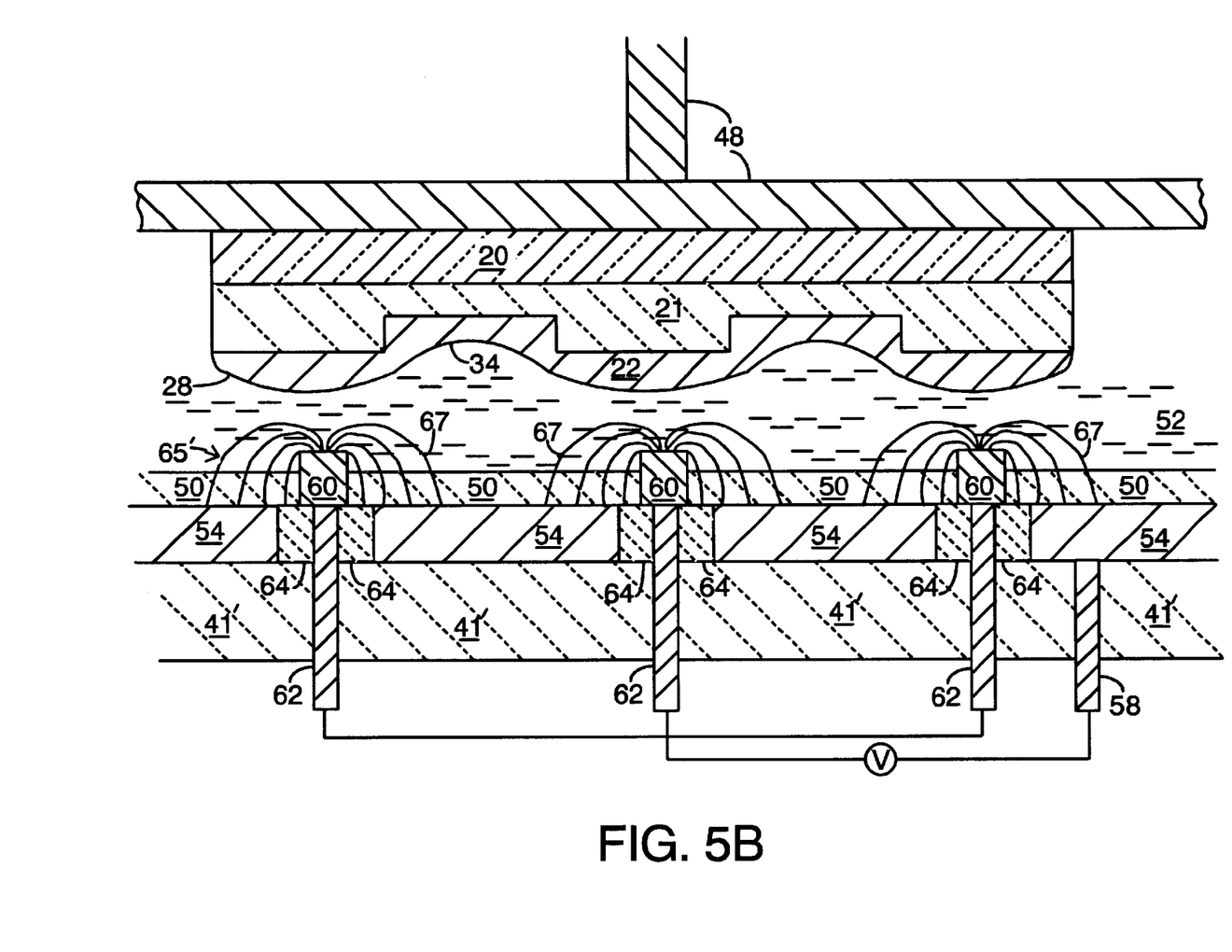
FIG. 5b illustrates an embodiment of the invention wherein a high electric field region is established near the polishing pad.

The embodiment shown in FIG. 5a can be modified slightly, as shown in FIG. 5b, to provide a different type of electrical field configuration. If contacts 60 are designed to protrude only slightly or not at all from the surface of polishing pad 50, so as not to come into physical contact with metal layer 22, the electric field lines 65' will be configured as shown in FIG. 5b, with a high field region 67 extending into the region between contact 60 and metal layer 22. Accordingly, the ER fluid in region 67 will stiffen. Raised metal regions 28 pass through this stiffened fluid region and are abraded more aggressively than lower metal regions 34 which do not encounter the stiffened ER fluid. Once all the high points on metal layer 22 have been removed, the polish rate will be even across the metal layer. As soon as any part of the metal layer 22 physically contacts contact 60 and thus causes entire metal layer 22 to be at voltage V, the electric field in the ER fluid in region 67, and therefore the stiffness of the ER fluid, will be significantly reduced because the effective electrode size will be significantly increased. It is well known that the electric field near a sharp edge electrode is much greater than near an electrode with a large surface area. An aspect of this embodiment, which may be advantageous or disadvantageous according to the particular application, is that the stiffened region 67 of the ER fluid is stationary near contacts 60, and is not subject to frequency dependent effects as described hereinafter. Applied voltage V may be either DC, yielding a constant stiffened ER fluid region 67, or AC, wherein the stiffened region 67 would occur periodically.

Other methods of establishing electrical contact with the front side of the wafer having the metal layer thereon might be utilized. By way of example, a conduit might be bored through the wafer at a chosen location, and a wire could be inserted therethrough from the wafer back side to make contact with the metal layer. The voltage would then be applied from the back side of the wafer.

Figure 6:
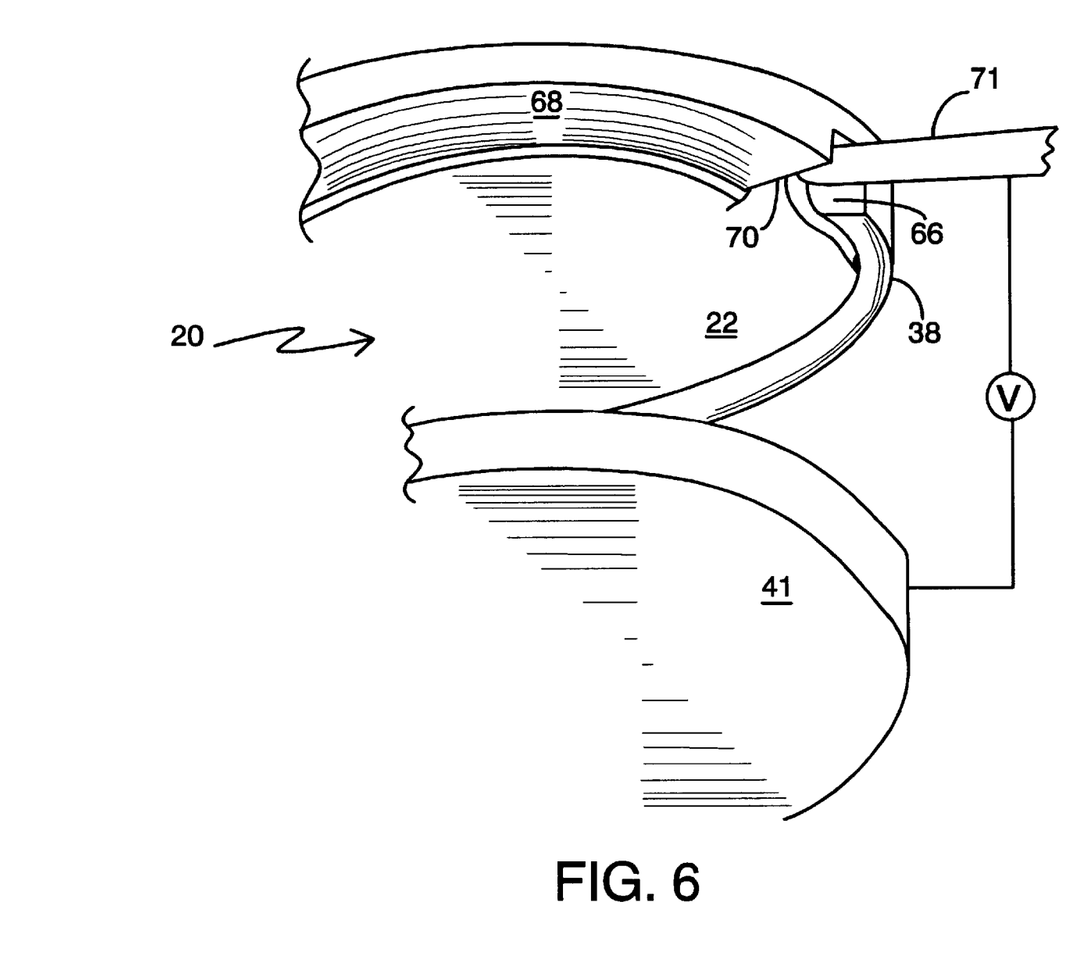
FIG. 6 illustrates another embodiment of the invention wherein electrical contact is made to the wafer front.

FIG. 6 illustrates a third embodiment of my invention wherein electrical contact is made to the front side of the wafer. Notch 66 is etched into outer region 68 of wafer 20, and metal contact 70 is deposited into at least a portion of notch 66 simultaneously with deposition of metal layer 22. If metal is not deposited all the way to edge 38 of the wafer, a conducting lead 71 may be embedded in notch 66 and electrically connected to contact 70, without protruding above the wafer surface, and extending beyond edge 38. Metal contact 70 is contiguous with metal layer 22, and therefore when voltage V is applied between lead 71 and platen 41, it is simultaneously applied between metal layer 22 and platen 41.

Figure 7:
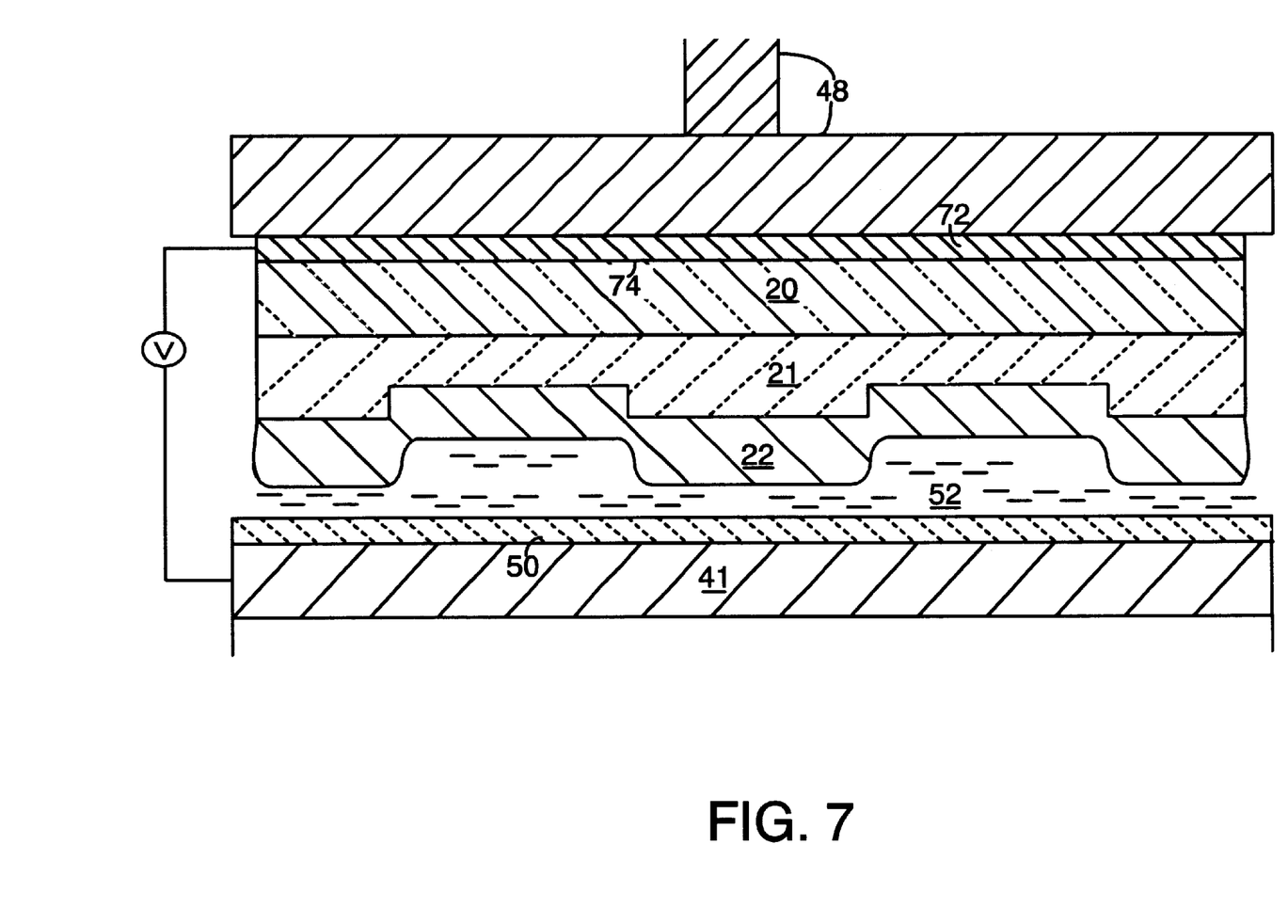
FIG. 7 illustrates an embodiment of the invention wherein electrical contact is made to the wafer back side.

FIG. 7 illustrates a fourth embodiment of my invention wherein electrical contact is made to the back side of the wafer. Voltage V is applied between platen 41 and contact 72 on backside 74 of wafer 20. It is known, for example in using defect inspection tools, that electrical contact with the backside of the wafer provides sufficient conduction through the wafer to establish a voltage on the wafer surface, for low current applications such as that of the present invention. This approach avoids the possibility of leaving islands of the metal on the surface of the wafer with no ground during processing, but introduces the possibility of charging formed devices by driving currents through the wafer.

Another aspect of my invention relates to the frequency dependence of the yield stress and therefore the viscosity of the ER fluid, according to equation (1):

$$\tau_0(E,\omega) \, E^2 \beta_{\mathit{eff}}^2(\omega) \tag{1}$$

The frequency dependence of the yield stress $\tau_0$ stems from the frequency dependence of the effective relative particle polarizability $\beta_{\mathit{eff}}$, a quantity which relates to the conductivities and dielectric constants of the particulate and continuous phase of the ER material. This is described more fully by Klingenberg in the MRS Bulletin, August 1998, pp 30–34, which is hereby incorporated by reference. The ER fluid and its components can be chosen so as to exhibit a desired frequency dependence. For example, suspensions of barium titanate particles in silicon oil evidence a yield stress which increases with frequency. In contrast, for suspensions of alumina particles in silicone oil, the yield stress decreases with frequency.

Figure 8:
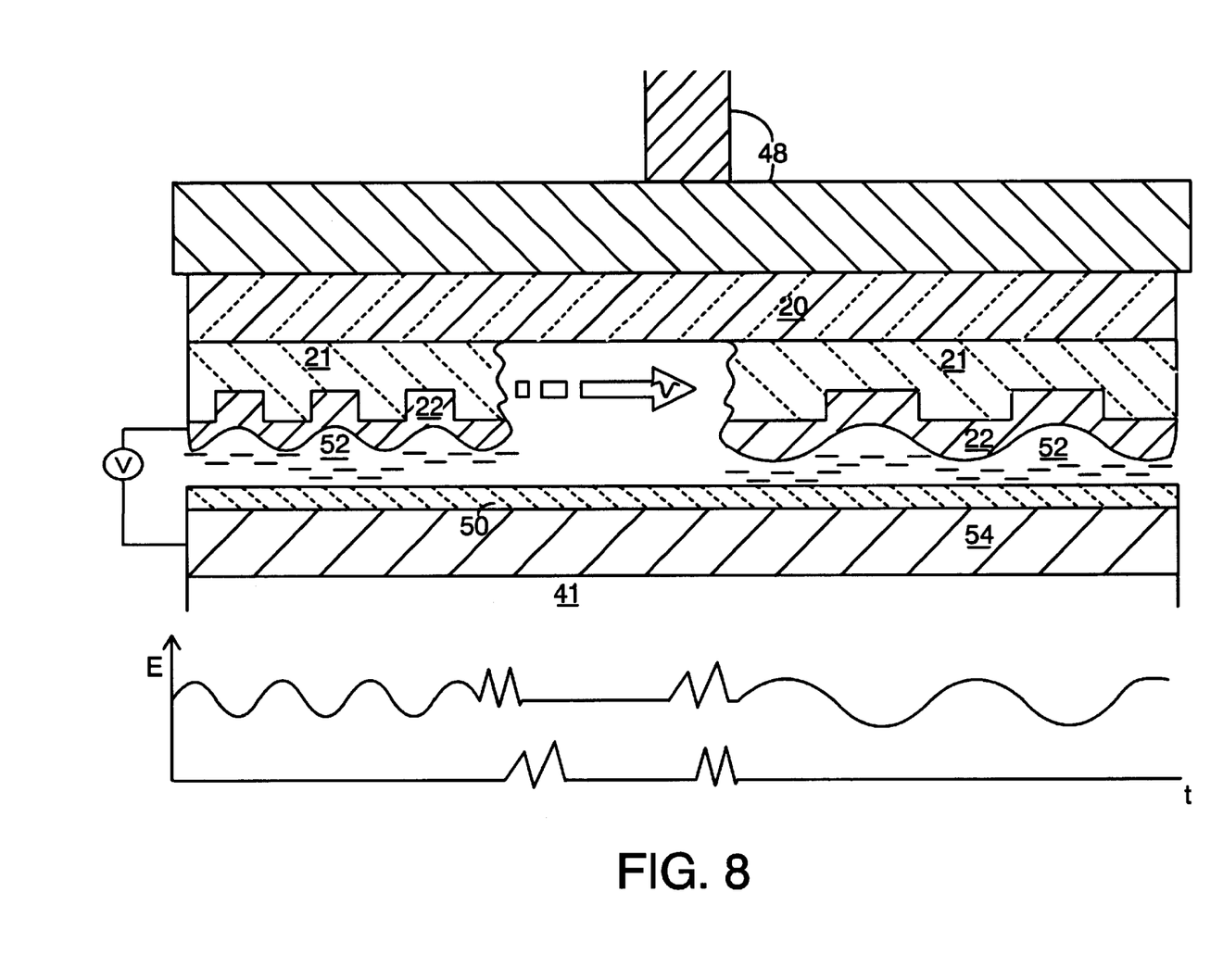
FIG. 8 illustrates the relationship between electrical field frequency and metal pattern density.

If the voltage is applied across the ER fluid 26 by establishing a voltage difference between platen 41 and metal layer 22, and assuming the voltage is DC, the frequency ($\omega$) of the electric field across the ER fluid 26 depends on two factors: (1) the rotational velocity of the spindle 48 and wafer 20 relative to the polishing pad 50, and (2) the number of metal lines in a given area, i.e., the metal pattern density. The higher the pattern density, the higher the electric field frequency across the ER fluid at a given point on the stationary platen 41. This effect is illustrated in FIG. 8, assuming a stationary ER fluid for simplicity.

By tailoring the ER fluid to the application, the frequency dependence of the yield stress can be advantageously utilized. For example, in standard CMP of Damascene structures, it is well known that erosion is greater in the high line density areas. Using my polishing approach, by choosing an ER fluid which evidences lower yield stress for higher frequency, such as the aforementioned alumina in silicone oil, the polishing rate would be lower in the high density areas and thereby the cause of the erosion problem would be ameliorated.

As feature sizes decrease and line density increases, the ER fluid response time must also decrease. For example, with a metal feature pitch of 0.32 microns, and with typical spindle rotational velocities, the electric field frequency imposed on an ER fluid would exceed 10 MHz. The response time of the dielectric dispersion in the ER fluid preferably will equal or exceed this frequency.

Another embodiment of my invention utilizes a MR fluid in place of, or in combination with, an ER fluid for metal CMP. The electric field is a local quantity which varies according to localized topography and feature density, and therefore use of ER fluid provides localized tuning of polishing rates. In contrast, use of MR fluids allows global adjustments of polishing rates. For example, if the polishing rate is greater at the center of the wafer, as illustrated in FIG. 1b, an external magnetic field can be established which has higher magnitude at the wafer edge region, in order to equalize the polishing rate across the wafer.

A composite of ER particles and MR particles dispersed in a continuous phase increases the complexity of the slurry and the process, yet allows for even more control over the polishing process. As previously described, the ER fluid can locally tune the polishing rates, while the MR fluid can establish polishing zones to improve the global planarity of the wafer surface.

By utilizing ER and MR fluids as components of polishing slurries according to my invention, many of the problems currently existing with CMP of metal can be avoided, including recession, erosion, and other types of non-uniformity of polish rate across the wafer.

The invention should not be considered limited to the exact implementations and embodiments described herein. For example, other methods of providing electrical contact to the metal layer on the wafer, or to establish an electric field across the ER fluid, may be utilized without altering the inventive concept. The scope of the invention should be construed in view of the claims.

With this in mind, I claim:

1. An integrated circuit manufacturing process for Chemically Mechanically Polishing (CMP) a metal layer on a semiconductor wafer, said wafer having a front side, said process comprising the steps of:
    providing a polishing apparatus including a platen having a polishing pad thereon;
    flowing a slurry including a fluid including a field responsive material exhibiting a characteristic dramatic rheological change in its viscosity in response to an external electromagnetic field on said polishing pad;
    establishing an electromagnetic field across a portion of said fluid, said field being of sufficient intensity to control the viscosity of said fluid contacting said metal layer to induce abrasion of said metal layer on said front surface of said wafer; and
    moving said wafer across said polishing pad.

2. The process of claim 1 wherein said step of establishing an electromagnetic field across a portion of said fluid comprises establishing an electric field to control said viscosity.

3. The process of claim 1 wherein said step of establishing an electromagnetic field across a portion of said fluid comprises establishing a magnetic field to control said viscosity.

4. In an integrated circuit manufacturing process for Chemically Mechanically Polishing a metal layer on a semiconductor wafer, said method including causing relative motion between said wafer and a polishing pad and flowing a polishing slurry between said wafer and said polishing pad, the improvement comprising:
    flowing said polishing slurry including flowing an insulating ElectroRheological (ER) fluid; and
    establishing an electric field across said ER fluid, said electric field having an intensity sufficiently high to cause said ER fluid to stiffen enough to sustain abrasion of said metal layer.

5. An integrated circuit manufacturing process for Chemically Mechanically Polishing (CMP) a metal layer on a semiconductor wafer, said wafer having a front side, an edge surface, and a back side, said process comprising the steps of:
    providing a polishing apparatus including a platen having a polishing pad thereon;
    flowing an insulating ElectroRheological (ER) fluid comprising a continuous phase fluid including ER particles dispersed therein on said polishing pad;
    establishing an electric field within said ER fluid; and
    rotating said wafer across said polishing pad.

6. The process of claim 5, wherein said continuous phase fluid is selected from the group consisting of: silicone oils, mineral oils, paraffin oils, hydraulic oils, transformer oils, perfluorinated polyethers, and combinations thereof, and wherein said ER particles are selected from the group consisting of: silica, alumina, titania, barium titanate, semiconductors, weakly conducting polymers, zeolites, polyhydric alcohol, sodium carboxymethyl Sephadex, alginic acid, carboxymethyl Sephadex, lithium hydrazinium sulfate, and combinations thereof.

7. The process of claim 5 including:
    providing said platen with an array of bores having insulated sheaths therethrough;
    providing said polishing pad with an array of conducting contacts embedded therein, said polishing pad array being coincident with said platen array, said conducting contacts being in electrical contact with metal pins directed through said insulated sheaths; and
    applying a voltage between said metal pins and said platen.

8. The process of claim 5 wherein the step of establishing an electric field within said ER fluid includes making electrical contact to said metal layer at said front side of said wafer.

9. The process of claim 8 including:
    providing said platen with an array of bores having insulated sheaths therethrough;
    providing said polishing pad with an array of soft conducting contacts embedded therein and protruding therefrom, said polishing pad array being coincident with said platen array, said soft conducting contacts being in electrical contact with metal pins directed through said insulated sheaths;
    applying a voltage between said metal pins and said platen;
    placing said metal layer into physical contact with at least one said soft conducting contact continuously as said wafer is rotated across said polishing pad, said applied voltage thereby being established between said platen and said metal layer.

10. The process of claim 8 including:
    prior to formation of said metal layer on said wafer, etching a notch at a position on said wafer front side near the perimeter of said wafer and extending into the wafer region having said metal layer thereon, said notch extending to said wafer edge and being of sufficient depth and width dimension to support a conducting material embedded therein and not protruding above the top surface of said wafer;
    subsequent to formation of said metal layer on said wafer, embedding said conducting material in said notch and establishing electrical contact between said conducting material and said metal layer, said conducting material extending beyond said perimeter of said wafer; and applying a voltage between said conducting material and said platen.

11. The process of claim 5 wherein the step of establishing an electric field within said ER fluid includes making at least one electrical contact to said metal layer at said edge surface of said wafer.

12. The process of claim 11 wherein said step of making at least one electrical contact to said metal layer at said edge surface of said wafer comprises placing a plurality of contact pins in electrical contact with said edge surface of said wafer, said contact pins having a thickness less than the thickness of said wafer.

13. The process of claim 5 wherein the step of establishing an electric field within said ER fluid includes making electrical contact to said wafer at said back side of said wafer.

14. The process of claim 5 wherein said ER fluid exhibits higher yield stress for higher frequencies of applied electric field.

15. The process of claim 5 wherein said ER fluid exhibits lower yield stress for higher frequencies of applied electric field.

16. The process of claim 5 wherein said insulating ER fluid additionally includes at least one component selected from the group consisting of: oxidizers, thixotropic additives, surfactants, and abrasives.

17. The process of claim 5 further comprising the steps of:
said continuous phase fluid additionally containing MagnetoRheolological (MR) particles dispersed therein; and
establishing a global magnetic field about said wafer, said global magnetic field being configured to adjust the relative polish rates of said CMP across said wafer to reduce WIWNU.

18. An integrated circuit manufacturing process for Chemically Mechanically Polishing (CMP) a metal layer on a semiconductor wafer, said wafer having a front side, an edge surface, and a back side, said process comprising the steps of:
providing a polishing apparatus including a platen having a polishing pad thereon;
flowing an insulating MagnetoRheological (MR) fluid comprising a continuous phase fluid including MR particles dispersed therein on said polishing pad;
establishing a global magnetic field about said wafer, said global magnetic field being configured to adjust the relative polish rates of said CMP across said wafer to reduce WIWNU; and
rotating said wafer across said polishing pad.

19. The process of claim 18, wherein said continuous phase liquid is chosen from the group consisting of: H2O, silicone oils, kerosene, mineral oils, paraffin oils, hydraulic oils, transformer oils, halogenated aromatic liquids, halogenated paraffins, diesters, polyoxyalkylenes, fluorinated silicones, cornstarch, olefin oil, glycol, and combinations thereof; and
wherein said MR particles are chosen from the group consisting of: iron, iron alloys, iron oxide, iron nitride, iron carbide, carbonyl iron, low carbon steel, silicon steel, chromium dioxide, fumed or pyrogenic silica, silica gel, titanium dioxide, magnetite, nickel, cobalt, manganese, zinc, ceramic ferrites, and combinations thereof.

20. The process of claim 18 wherein said MR fluid additionally includes at least one component selected from the group consisting of: oxidizers, thixotropic additives, surfactants, and abrasives.

* * * * *